(12) United States Patent
Kaito

(10) Patent No.: US 8,127,400 B2
(45) Date of Patent: Mar. 6, 2012

(54) PORTABLE TERMINAL APPARATUS

(75) Inventor: Yoshihiko Kaito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/219,935

(22) Filed: Jul. 30, 2008

(65) Prior Publication Data

US 2009/0077769 A1   Mar. 26, 2009

(30) Foreign Application Priority Data

Sep. 25, 2007 (JP) ................................ 2007-246606

(51) Int. Cl.
*E05C 17/64* (2006.01)
(52) U.S. Cl. ..... 16/342; 16/374; 379/433.13; 455/575.3
(58) Field of Classification Search .................... 16/342, 16/337, 374, 379, 386, 387; 379/433.13; 455/575.3; 361/679.27
See application file for complete search history.

(56) References Cited

U.S. PATENT DOCUMENTS

| | | | |
|---|---|---|---|
| 6,543,088 B2 * | 4/2003 | Koshikawa | 16/303 |
| 6,985,580 B2 * | 1/2006 | Lu et al. | 379/433.13 |
| 7,380,312 B2 * | 6/2008 | Ge et al. | 16/342 |
| 7,433,467 B2 * | 10/2008 | Yi | 379/433.13 |
| 2005/0107139 A1 * | 5/2005 | Pan | 455/575.3 |

FOREIGN PATENT DOCUMENTS

| | | |
|---|---|---|
| JP | 5-336022 | 12/1993 |
| JP | 2003-184861 | 7/2003 |
| JP | 2004-084805 | 3/2004 |

OTHER PUBLICATIONS

Japanese Office Action mailed Nov. 22, 2011 issued in corresponding Japanese Patent Application No. 2007-246606.

\* cited by examiner

*Primary Examiner* — William L. Miller
(74) *Attorney, Agent, or Firm* — Staas & Halsey LLP

(57) ABSTRACT

A portable terminal apparatus includes a first body having a base, to which a first hinge arm is provided, the first hinge arm including a first axis hole having a protrusion extending axially; and a second body having a base, to which a second hinge arm including a second axis hole is provided. The apparatus also includes a hinge axis that includes an axially provided groove to be engaged with the protrusion, and that is fitted to the first axis hole and the second axis hole, so as to connect the first body and the second body, allowing opening and closing movements of the first body and the second body. The protrusion is formed such that an end of the protrusion facing the second hinge arm is positioned inside the first axis hole inwardly from an end of the first axis hole.

2 Claims, 6 Drawing Sheets

PORTABLE TERMINAL APPARATUS

BACKGROUND OF THE INVENTION

1. Field of the Invention

The present invention relates to a portable terminal apparatus such as a folding portable telephone apparatus.

2. Description of the Related Art

In portable telephone apparatuses (portable terminal apparatuses), a mouthpiece unit (a first body) has an attachment section (a first hinge arm) including an attachment hole (a first axis hole), inside of which a pair of engaging protrusions are provided at intervals of 180° along the entire length of the axis. Further, an axis-shaped case (a hinge axis) constituting a hinge has recessed grooves axially provided on an outer circumference thereof. The hinge is fitted to the attachment hole such that the recessed grooves are engaged with the engaging protrusions, allowing the mouthpiece unit (the first body) to be foldably attached to an earpiece unit (a second body) via the hinge (i.e., the case, the hinge axis). Related technology has been disclosed in, for example, Japanese Patent Application Laid-open No. 2004-84805.

In the related-art portable terminal apparatus, the engaging protrusions in the attachment hole (the first axis hole) are formed up to end faces of the attachment section (the first hinge arm). This structure has a problem that, when strong force such as twisting force acts between the mouthpiece unit (the first body) and the earpiece unit (the second body), the force is concentrated on bases of the engaging protrusions at the end faces of the attachment section (the first hinge arm), causing cracking in the bases and thus easily breaking the attachment section (the first hinge arm). This problem is significant in apparatuses in which large stress is applied to the attachment section (the first hinge arm), for example, in portable telephone apparatuses used to view a television image by rotating a liquid crystal display (the second body) thereof sideways.

SUMMARY OF THE INVENTION

It is an object of the present invention to at least partially solve the problems in the conventional technology.

According to an aspect of the present invention, a portable terminal apparatus includes a first body having a base, to which a first hinge arm is provided, the first hinge arm including a first axis hole having a protrusion extending axially; and a second body having a base, to which a second hinge arm including a second axis hole is provided. The apparatus also includes a hinge axis that includes an axially provided groove to be engaged with the protrusion, and that is fitted to the first axis hole and the second axis hole, so as to connect the first body and the second body, allowing opening and closing movements of the first body and the second body. The protrusion is formed such that an end of the protrusion facing the second hinge arm is positioned inside the first axis hole inwardly from an end of the first axis hole.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of a portable terminal apparatus according to the present invention will now be described with reference to the accompanying drawings. The present invention is not limited by these embodiments.

Figure 1:
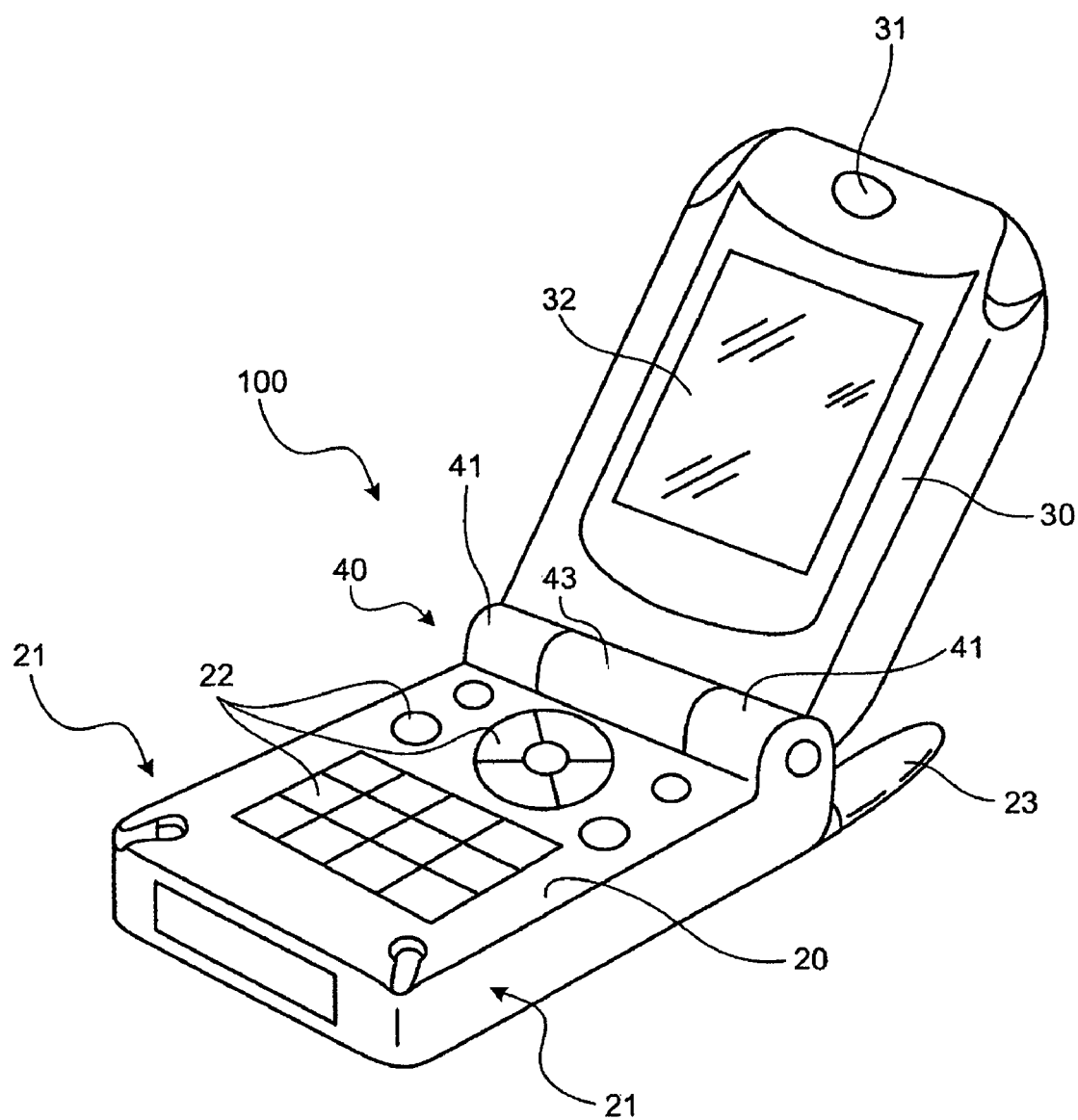
FIG. 1 is a schematic perspective view of an appearance of a portable terminal apparatus according to a first embodiment of the present invention.
Figure 2:
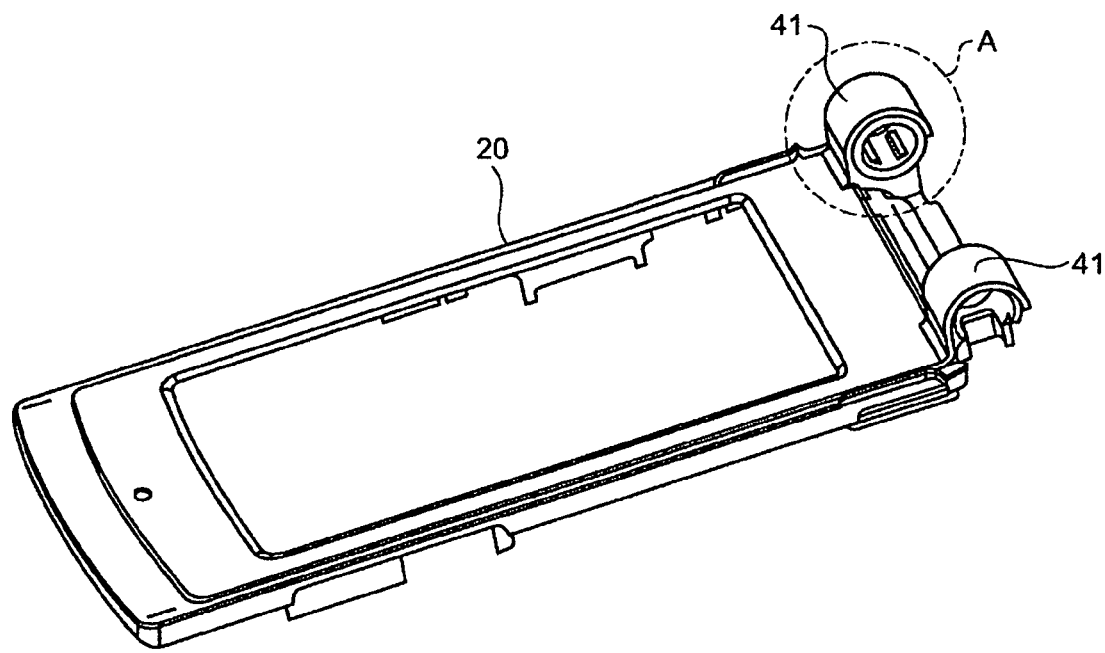
FIG. 2 is a perspective view of a first body of the portable terminal apparatus shown in FIG. 1.
Figure 3:
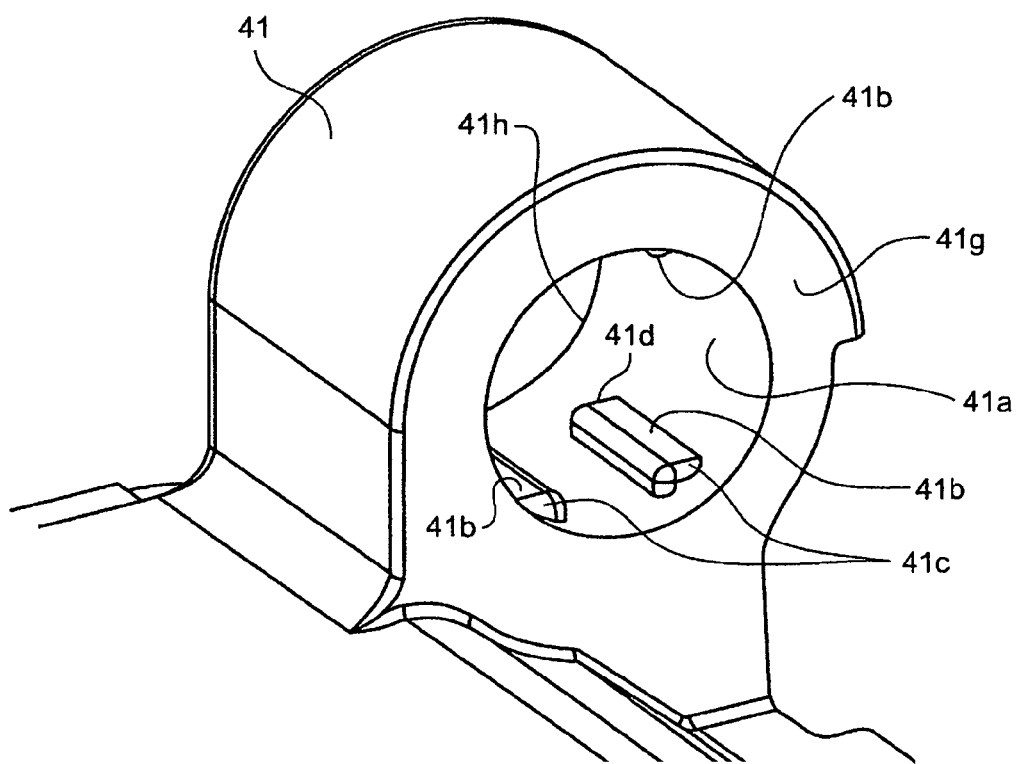
FIG. 3 is a perspective view of a first hinge arm shown in FIG. 1, depicting an enlarged portion A shown in FIG. 2.
Figure 4:
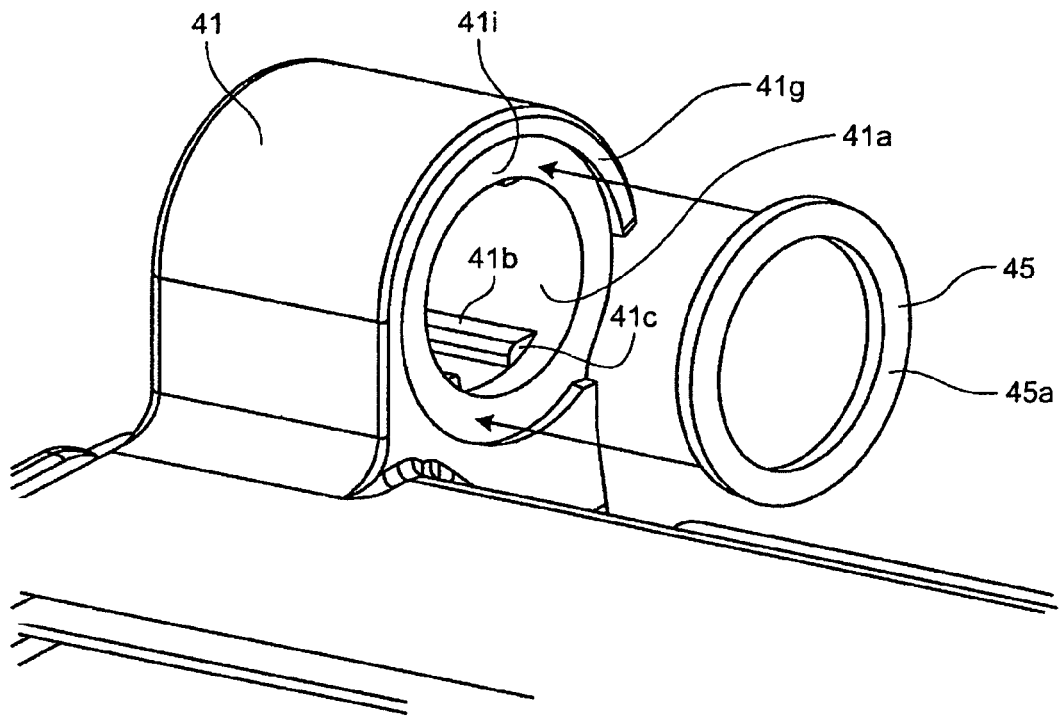
FIG. 4 is a perspective view of the first hinge arm to which a slide ring is not attached yet.
Figure 5:
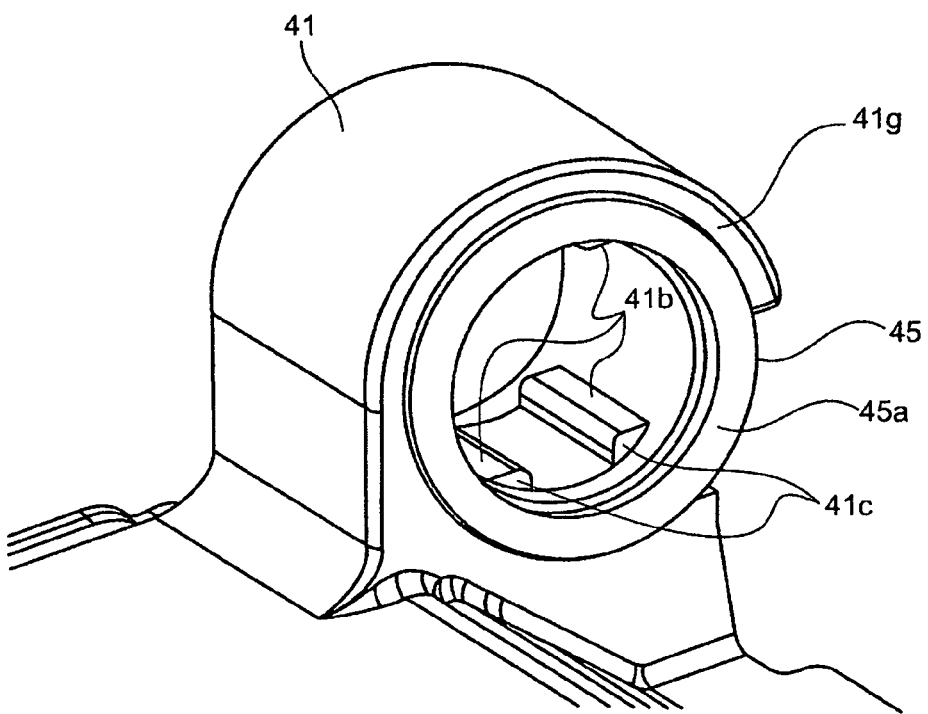
FIG. 5 is a perspective view of the first hinge arm with the slide ring attached.
Figure 6:
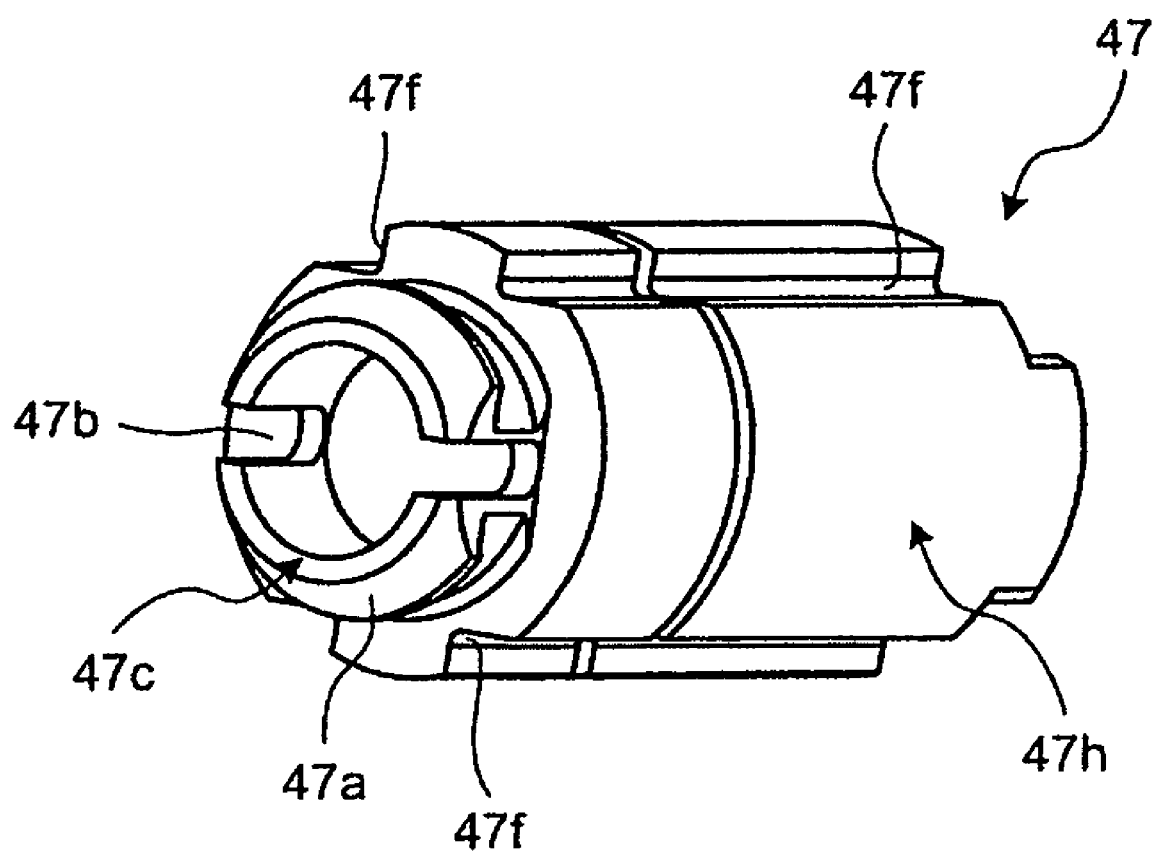
FIG. 6 is a perspective view of a hinge axis.
Figure 7:
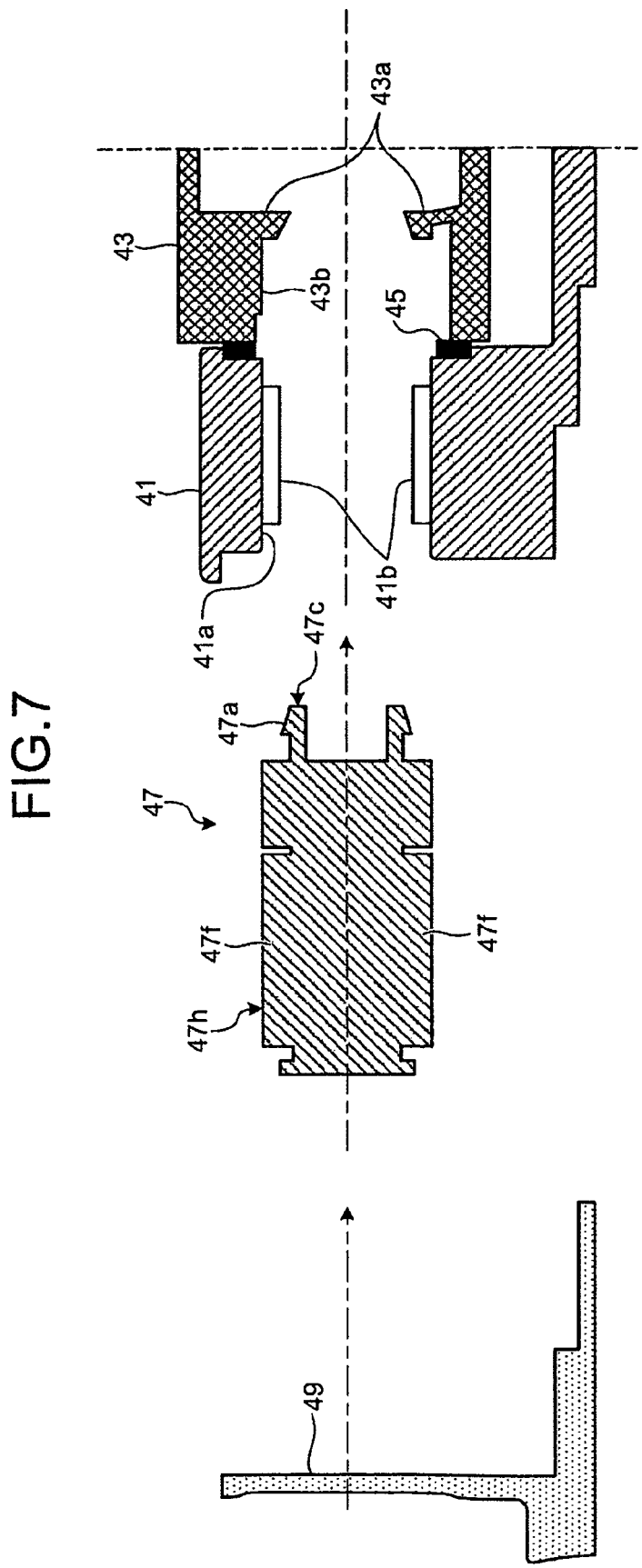
FIG. 7 is a cross-sectional view of a hinge unit, to which the hinge axis is not fitted yet.
Figure 8:
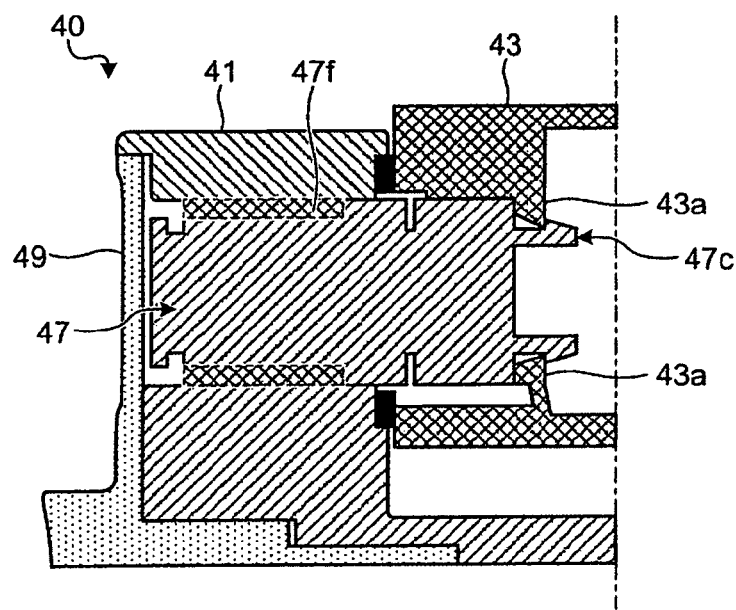
FIG. 8 is a cross-sectional view of the hinge unit with the hinge axis fitted.

FIG. 1 is a schematic perspective view of an appearance of a portable terminal apparatus according to a first embodiment of the present invention. FIG. 2 is a perspective view of a first body of the portable terminal apparatus according to the first embodiment, and FIG. 3 is a perspective view of a first hinge arm, depicting an enlarged portion A shown in FIG. 2. FIG. 4 is a perspective view of the first hinge arm to which a slide ring is not attached yet, and FIG. 5 is a perspective view of the first hinge arm with the slide ring attached. FIG. 6 is a perspective view of a hinge axis, FIG. 7 is a cross-sectional view of a hinge unit to which the hinge axis is not fitted yet, and FIG. 8 is a cross-sectional view of the hinge unit with the hinge axis fitted.

As shown in FIG. 1, a portable telephone apparatus 100 serving as a portable terminal apparatus includes a first body 20 and a second body 30 that are palm-sized rectangular solids, and a hinge unit 40 that connects the first body 20 and the second body 30, allowing opening and closing movements thereof.

The first body 20 includes a mouthpiece unit 21, operation keys 22 such as dial and functional keys, and an antenna 23. The second body 30 includes an earpiece unit 31 and a liquid crystal display 32. FIG. 1 depicts the second body 30 being in an open position. To both ends of a base of the first body 20 are provided first hinge arms 41, and to a center portion of a base of the second body 30 is provided a second hinge arm 43.

As shown in FIGS. 2 and 3, first axis holes 41a are respectively formed in the first hinge arms 41. In each of the first axis holes 41a, a pair of protrusions 41b are provided to axially extend at a predetermined interval, each on upper and lower portions of the first axis holes 41a. Specifically, the protrusions 41b are formed such that inner-side ends 41c thereof (ends facing the second hinge arm 43) are positioned inside the first axis holes 41a inwardly by about 1 millimeter from ends (inner-side end faces 41g) of the first axis holes 41a. Similarly, outer-side ends 41d of the protrusions 41b are formed inside the first axis holes 41a inwardly by about 1 millimeter from outer-side end faces 41h of the first hinge arms 41.

As shown in FIG. 4, on each of the inner-side end faces 41g of the first hinge arms 41 is formed a ring-like recess 41i (in FIG. 3, the ring-like recess 41i is omitted). As shown in FIGS. 4 and 5, the ring-like recess 41i is to be attached with a ring-like slide ring 45. Each slide ring 45 has a thickness greater than the depth of the ring-like recess 41i, so that an inner surface 45a of the slide ring 45 protrudes inwardly from the inner-side end face 41g of each first hinge arm 41.

As shown in FIGS. 6 to 8, the first hinge arms 41 and the second hinge arm 43 are rotatably and movably connected by hinge axes 47 each formed substantially in a short cylinder as a whole. Each of the hinge axes 47 includes: a small-diameter engaging section 47c that includes a flange 47a and notches 47b, and that is inserted to and engaged with an inner flange 43a formed inside a second axis hole 43b of the second hinge arm 43 so as to retain the hinge axis 47; and a large-diameter axis section 47h that has a pair of grooves 47f axially provided each on upper and lower portions of the hinge axis 47.

To connect each of the first hinge arms 41 and the second hinge arm 43, the second hinge arm 43 is inserted between the first hinge arms 41 so that the axial cores of the first axis holes 41a coincide with the axis core of the second axis hole 43b. Then, with the engaging section 47c pointing to the first hinge arm 41 from the outside, the hinge axis 47 is fitted to the first axis hole 41a and the second axis hole 43b.

Specifically, each pair of grooves 47f axially extending along the hinge axis 47 are engaged with the associated pair of protrusions 41b inside the first axis holes 41a, so that the hinge axis 47 is stopped to rotate. Further, the engaging section 47c, which is a head of the hinge axis 47, is inserted to and engaged with the inner flange 43a of the second axis hole 43b, so that the hinge axis 47 is retained. Then, a cap 49 is attached to the outer side of each of the first hinge arms 41, so that the portable telephone apparatus 100 is fully assembled.

Inside the second axis hole 43b of the second hinge arm 43, no protrusion is formed for stopping rotation of the hinge axis 47. Further, the slide ring 45 resides between the second hinge arm 43 and each of the first hinge arms 41. This enables the second hinge arm 43 to move rotationally and smoothly relative to the first hinge arms 41.

As shown in FIG. 4, the protrusions 41b are formed such that the inner-side ends 41c thereof (the ends facing the second hinge arm 43) are positioned in the first axis holes 41a inwardly by about 1 millimeter from the ends of the first axis holes 41a (ring-like recesses 41i), allowing the ends of the first axis holes 41a to have a full round shape. Accordingly, even when strong twisting or bending force acts between the first body 20 and thus the second body 30 and strong force acts on the protrusions 41b, stress concentration does not occur on the ends of the first axis holes 41a. This prevents cracking due to stress concentration from occurring on the ends of the first axis holes 41a, thus preventing breakage of the first hinge arms 41.

Figure 9:
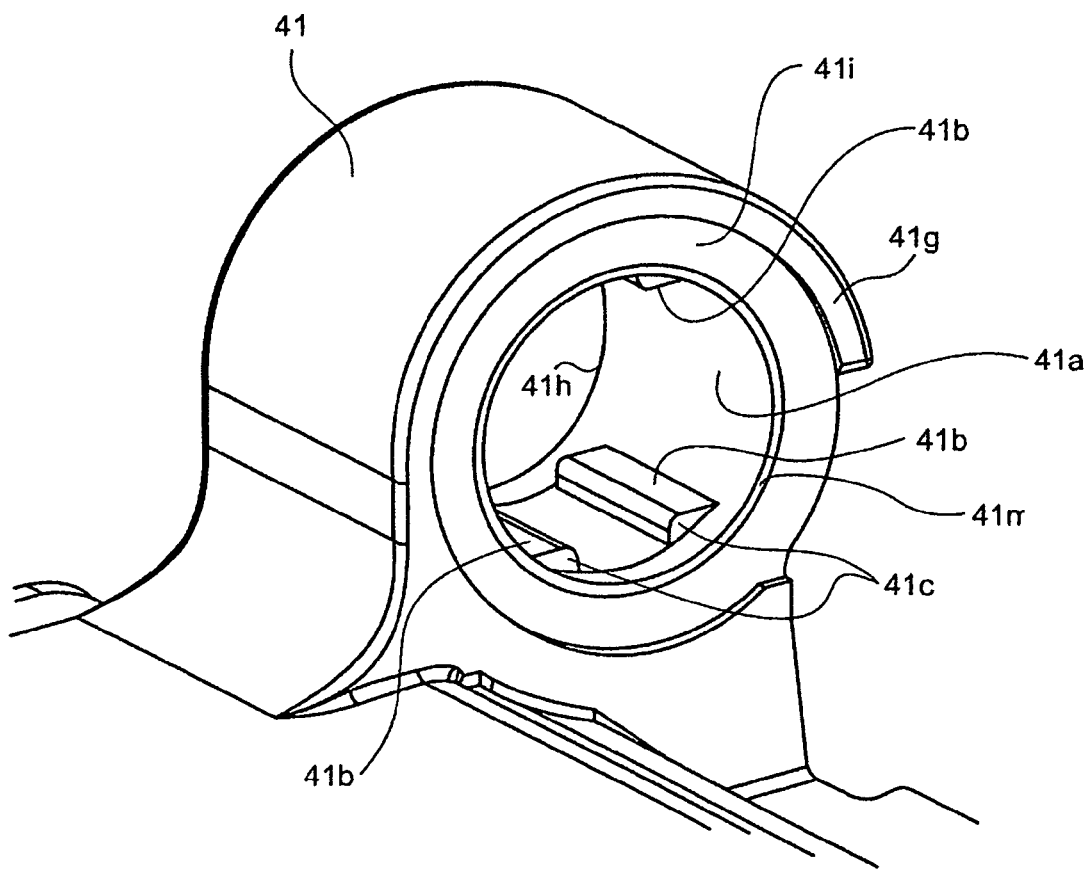
FIG. 9 is a perspective view of a first hinge arm of a portable terminal apparatus according to a second embodiment of the present invention.

FIG. 9 is a perspective view of a first hinge arm of a portable terminal apparatus according to a second embodiment of the present invention. The portable terminal apparatus according to the second embodiment differs from that of the first embodiment, regarding the shape of a portion of a first hinge arm 41 shown in FIG. 9. Thus, the different portion is described, and descriptions of other portions are omitted.

As shown in FIG. 9, the inner-side ends 41c of the protrusions 41b (the ends facing the second hinge arm 43) are formed in the first axis holes 41a inwardly by about 1 millimeter from the ring-like recesses 41i of the first hinge arms 41. Further, on the ends of the first axis holes 41a are formed chamfered sections 41m each having a full round shape.

Accordingly, even when strong twisting or bending force acts between the first body 20 and the second body 30 and thus large force acts on the protrusions 41b, no large stress occurs on the ends of the first axis holes 41a. Further, the ends have the full-round chamfered sections 41m formed thereon and thus have no edges. This allows less stress to be applied due to hitting to edges of the hinge axis 47, making it unlikely to cause cracking. The chamfered sections 41m may be formed to have an increased diameter so as to form a curved shape (i.e., so as to form an arc shape).

In the first and the second embodiments, to both ends of the base of the first body 20 are provided the first hinge arms 41, and to the center portion of the base of the second body 30 is provided the second hinge arm 43. Alternatively, a first hinge arm 41 may be provided to the center portion of the base of the first body 20, and second hinge arms 43 may be provided to both ends of the base of the second body 30.

The first and the second embodiments are described as being applied to the portable telephone apparatus as a portable terminal apparatus. The present invention is not limited to these embodiments, and may be applied to various portable terminal apparatuses including: small-sized information processing terminals such as personal digital assistants (PDAs); small-sized music playback apparatuses; portable televisions; and portable game apparatuses.

According to an embodiment of the present invention, less stress is concentrated on an end face of a first hinge arm, achieving such an advantage that the first hinge arm is hardly broken.

According to an embodiment of the present invention, further less stress is concentrated on the end face of the first hinge arm.

According to an embodiment of the present invention, further less stress is concentrated on the end face of the first hinge arm.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A portable terminal apparatus comprising:
   a first body having a base, to which a first hinge arm is provided, the first hinge arm including a first axis hole having a protrusion extending axially, wherein an end of the first axis hole has a chamfered section formed thereon;
   a second body having a base, to which a second hinge arm including a second axis hole is provided; and
   a hinge axis that includes an axially provided groove to be engaged with the protrusion, and that is fitted to the first axis hole and the second axis hole, as to connect the first body and the second body, allowing opening and closing movements of the first body and the second body,
   the protrusion being formed such that an end of the protrusion facing the second hinge arm is positioned inside the first axis hole inwardly from the end of the first axis hole facing the second hinge arm.

2. A portable terminal apparatus comprising:
   a first body having a base, to which a first hinge arm is provided, the first hinge arm including a first axis hole having a protrusion extending axially, wherein an end of the first axis hole has a chamfered section forming an arc shape;
   a second body having a base, to which a second hinge arm including a second axis hole is provided; and
   a hinge axis that includes an axially provided groove to be engaged with the protrusion, and that is fitted to the first axis hole and the second axis hole, so as to connect the first body and the second body, allowing opening and closing movements of the first body and the second body, the protrusion being formed such that an end of the protrusion facing the second hinge arm is positioned inside the first axis hole inwardly from an end of the first axis hole facing the second hinge arm.

* * * * *

UNITED STATES PATENT AND TRADEMARK OFFICE
CERTIFICATE OF CORRECTION

PATENT NO. : 8,127,400 B2
APPLICATION NO. : 12/219935
DATED : March 6, 2012
INVENTOR(S) : Yoshihiko Kaito Page 1 of 1

It is certified that error appears in the above-identified patent and that said Letters Patent is hereby corrected as shown below:

Column 6, Line 1, In Claim 2, delete "an" and insert -- the --, therefor.

Signed and Sealed this
Twenty-second Day of May, 2012

David J. Kappos
*Director of the United States Patent and Trademark Office*